(12) United States Patent
Mori et al.

(10) Patent No.: US 7,166,336 B1
(45) Date of Patent: Jan. 23, 2007

(54) DLC FILM, DLC-COATED PLASTIC CONTAINER, AND METHOD AND APPARATUS FOR MANUFACTURING DLC-COATED PLASTIC CONTAINER

(75) Inventors: Shigeki Mori, Saitama (JP); Yuuji Yamashita, Saitama (JP); Tsuyoshi Kage, Tokyo (JP)

(73) Assignees: Mitsubishi Shoji Plastics Corporation, Tokyo (JP); Hokkai Can Co., Ltd., Tokyo (JP); Kirin Brewery Company Limited, Tokyo (JP)

( * ) Notice: Subject to any disclaimer, the term of this patent is extended or adjusted under 35 U.S.C. 154(b) by 0 days.

(21) Appl. No.: 10/019,852

(22) PCT Filed: Apr. 21, 2000

(86) PCT No.: PCT/JP00/02648

§ 371 (c)(1),
(2), (4) Date: Nov. 7, 2001

(87) PCT Pub. No.: WO00/71780

PCT Pub. Date: Nov. 30, 2000

(30) Foreign Application Priority Data

| May 19, 1999 | (JP) | ................................. 11-139211 |
| Oct. 21, 1999 | (JP) | ................................. 11-299806 |
| Feb. 24, 2000 | (JP) | ............................ 2000-048386 |

(51) Int. Cl.
| B05D 7/22 | (2006.01) |
| C23C 16/26 | (2006.01) |
| C23C 16/507 | (2006.01) |
| C23C 16/609 | (2006.01) |
| H05H 1/46 | (2006.01) |
| C23C 16/27 | (2006.01) |

(52) U.S. Cl. ...................... 427/577; 427/238; 427/569; 427/249.7; 118/723 E; 118/723 R; 118/728

(58) Field of Classification Search ................ 427/577, 427/569, 238, 249.7; 118/723 E, 723 MP, 118/728; 428/445 R, 446, 688; 215/12.1, 215/12.2
See application file for complete search history.

(56) References Cited

U.S. PATENT DOCUMENTS

| 4,809,876 | A | * | 3/1989 | Tomaswick et al. | ......... 428/484 |
| 5,798,139 | A | * | 8/1998 | Nagashima et al. | ......... 427/577 |
| 5,844,225 | A | * | 12/1998 | Kimock et al. | ............. 428/698 |
| 6,294,226 | B1 | * | 9/2001 | Shimamura | .................. 427/577 |
| 6,589,619 | B1 | * | 7/2003 | Nagashima et al. | ....... 428/36.6 |
| 6,805,931 | B1 | * | 10/2004 | Nagashima | ................. 428/36.6 |
| 6,827,972 | B1 | * | 12/2004 | Darras et al. | ................ 427/237 |
| 6,854,309 | B1 | * | 2/2005 | Shimada | ......................... 72/46 |
| 6,919,114 | B1 | * | 7/2005 | Darras et al. | .............. 428/36.7 |
| 6,924,001 | B1 | * | 8/2005 | Hama et al. | ................. 427/237 |
| 7,029,752 | B1 | * | 4/2006 | Hama et al. | ................. 728/408 |
| 2002/0055012 | A1 | * | 5/2002 | Chou et al. | .................. 428/688 |
| 2003/0124229 | A1 | * | 7/2003 | Homa et al. | ................. 426/106 |
| 2003/0207115 | A1 | * | 11/2003 | Nagashima | ................. 428/408 |
| 2005/0003124 | A1 | * | 1/2005 | Beldi et al. | ................. 428/35.7 |
| 2005/0019577 | A1 | * | 1/2005 | Outreman et al. | .......... 428/408 |
| 2005/0155553 | A1 | * | 7/2005 | Hama et al. | ................. 118/719 |
| 2005/0266191 | A1 | * | 12/2005 | Hama et al. | ................ 428/35.7 |
| 2006/0051539 | A1 | * | 3/2006 | Yamasaki et al. | ........... 428/35.7 |

FOREIGN PATENT DOCUMENTS

| JP | 63-004068 | 1/1988 |
| JP | 06-280012 | 10/1994 |
| JP | 08-053116 | 2/1996 |
| JP | 10-226884 | 8/1998 |
| JP | 11-246974 | 9/1999 |
| JP | 11-256331 | 9/1999 |
| WO | WO 98/37259 | 2/1998 |

OTHER PUBLICATIONS

JPO Machine translation of JP 11-256331A to Zenitani Toshihiro et al—incomplete—, Sep. 1999.*
JPO Machine Translation of JP 10-226,884 to Shimamura Hidenori—incomplete—, Aug. 1998.*
Translation of JP 10-226,884 to Shimamura, published Aug. 25, 1998.*

Trans. of JP 11-256,331 to Zeniya et al, pub. Sep. 21, 1999.*
Trans of JP 06-280,012 to Taniguchi, pub. Oct. 4, 1994.*
Trans of Toshimichi Ito "Film-shaped Diamond & Amorphous Carbon Film . . . ", (1992, no month), all origionals previously cited.*
International Preliminary Examination Report.
Toshimichi ITO "Ceramics" 27 (3) (1992) pp. 219-225, no month given.

* cited by examiner

*Primary Examiner*—Marianne Padgett
(74) *Attorney, Agent, or Firm*—Hedman & Costigan; James V. Costigan

(57) ABSTRACT

Disclosed is an apparatus for producing DLC film-coated plastic containers, which comprises an outer electrode unit disposed outside a plastic container, an inner electrode disposed inside the plastic container, a duct through which a raw material gas of a carbon source is fed into the plastic container having been degassed, and a high-frequency oscillator for applying a voltage between the outer electrode unit and the inner electrode with a carbon source gas being fed into the container, thereby to generate plasma to form a DLC film on the inner surface of the plastic container. In the apparatus, the outer electrode unit comprises a bottom electrode disposed along the bottom of the plastic container, and a body electrode disposed along the body of the plastic container, and the upper edge of the bottom electrode is positioned below the center between the top and the bottom of the plastic container. DLC films having good oxygen barrier properties, and DLC film-coated plastic containers suitable to oxygen-sensitive drinks and to sparkling drinks are produced by the use of the apparatus. Also disclosed is a method for producing a DLC film on the inner surface of a plastic container by the use of the apparatus.

10 Claims, 2 Drawing Sheets

DLC FILM, DLC-COATED PLASTIC CONTAINER, AND METHOD AND APPARATUS FOR MANUFACTURING DLC-COATED PLASTIC CONTAINER

BACKGROUND OF THE INVENTION

1. Field of the Invention

The present invention relates to DLC film-coated plastic containers suitable to beers, sparkling wines, wines, high-fruit drinks and others that are sensitive to oxygen.

2. Description of the Related Art

In general, plastic containers are easy to form, lightweight and inexpensive, and are therefore widely used as packing containers in various fields of edibles, drinks, medicines, etc.

As well known, however, plastics have the property of passing low-molecular gases such as oxygen, carbon dioxide and others therethrough, and the property of absorbing or adsorbing low-molecular organic compounds. Therefore, as compared with glass containers, plastic containers are often limited for their applications and forms.

For example, in case where plastic containers are used for packing carbonated drinks such as beers and others, or wines, oxygen will penetrate them to time-dependently oxidize the drinks packed in them. In addition, carbon dioxide gas in the packed carbonated drinks will pass through the plastic containers outside them, and the drinks will go flat. Therefore, plastic containers are unsuitable to drinks that must not be oxidized, and to carbonated drinks.

On the other hand, in case where plastic containers are used for packing drinks with flavoring ingredients, such as orange juices and others, the flavoring ingredients of low-molecular organic compounds existing in the drinks (for example, limonene and others in orange juices) will be absorbed or adsorbed by them. As a result, the composition of the flavoring ingredients of the packed drinks will be unbalanced, and the quality of the drinks will become poor. For these reasons, plastic containers are unsuitable to drinks with flavoring ingredients.

The recent tendency in the art is toward recycling natural resources, for which the problem is how to collect and recover used containers. In case where plastics are used for returnable containers and used plastic containers are left as such after they are collected, they will absorb or adsorb various low-molecular organic compounds that will give musty odors. Accordingly, using plastics for returnable containers is limited, being different from the case of using glass for returnable containers.

However, as so mentioned hereinabove, plastic containers have the advantages of easy moldability, light weight and low costs. Using plastic containers for packing carbonated drinks, drinks with flavoring ingredients and the like, or for packing substances that require high purity, or using them as returnable containers, if possible, will be extremely convenient.

To meet the requirements, some techniques such as those mentioned below have been disclosed. Japanese Patent Laid-Open No. 53116/1996 discloses plastic containers with their inner surfaces being coated with a DLC (diamond-like carbon) film. Japanese Patent Laid-Open No. 53117/1996 discloses an apparatus and a method for producing the containers. Japanese Patent Laid-Open No. 258825/1998 discloses an apparatus and a method for producing DLC film-coated plastic containers on an industrial scale. Japanese Patent Laid-Open No. 226884/1998 discloses an apparatus and a method for uniformly coating containers with a DLC film, in which the containers to be coated are so modified that they have branches projecting outward from their outer surfaces.

The DLC film will be referred to as an i-carbon film or a hydrogenated amorphous carbon film (a-C: H) film, including hard carbon films. The DLC film is an amorphous carbon film, having SP3 bonds.

Forming such a DLC film on the inner surfaces of plastic containers will make the resulting plastic containers returnable.

SUMMARY OF THE INVENTION

The present invention is to provide a DLC film having good oxygen gas barrier properties; a DLC film-coated plastic container suitable to drinks sensitive to oxygen and to sparkling drinks, especially that with its inner surface being coated with a DLC film having a uniform thickness; and an apparatus and a method for producing the DLC film-coated plastic container.

The object of the invention is attained by an apparatus for producing DLC film-coated plastic containers, which comprises an outer electrode unit disposed outside a plastic container (5), an inner electrode (11) dispose inside the plastic container (5), a vacuum for reducing the inner pressure of the plastic container (5), a gas feeding unit (12, etc.) for feeding a raw material gas of a carbon source into the plastic container (5) having been subjected to a vacuum by a vacuum unit, and a power source unit (8,9) for applying a voltage between the outer electrode unit and the inner electrode (11) with a carbon source gas being fed into the container (5), thereby to generate plasma to form a DLC on the inner surface of the plastic container (5), and in which the outer electrode unit comprises a first outer electrode (4) disposed along the bottom of the plastic container (5), and a second outer electrode (3) disposed along the body of the plastic container (5), and the upper edge of the first outer electrode (4) is positioned below the center between the top and the bottom of the plastic container (5). This apparatus is hereinafter referred to as "apparatus with an outer electrode unit split in two sections". In this aspect of the invention, the outer electrode unit is split into the first outer electrode unit (4) and the second outer electrode (3), by which a suitable level of power can be applied to each site of the container to be coated. In the apparatus with an pouter electrode unit split in two sections of the invention, preferably, the power source unit (8,9) applies a higher power to the first outer electrode (4) than to the second outer electrode (3), a DLC film having a suitable thickness can be formed on the entire inner surface of the container (5).

The "bottom" of the plastic container includes not only the "bottom surface" of the container but also the "lower part of the body" thereof. The "lower part of the body" of the container specifically indicates the curved area thereof at which the bottom of the container communicates with the body thereof. The "body" of the plastic container indicates the body part thereof except the "lower part of the body" thereof.

In the apparatus with an outer electrode unit split in two sections, more preferably, the outer electrode unit is provided with a third outer electrode (2) disposed along the shoulder of the plastic container (5). The apparatus with an outer electrode unit split in two sections of the invention includes the more preferred embodiment, which is hereinafter referred to as "apparatus with an outer electrode unit split in two sections and with a third outer electrode".

The object of the invention is also attained by providing an apparatus for producing DLC film-coated plastic containers, which comprises an outer electrode unit disposed outside a plastic container (5), an inner electrode (11) disposed inside the plastic container (5), a degassing unit for reducing the inner pressure of the plastic container (5), a gas feeding unit (12, etc.) for feeding a raw material gas of a carbon source into the plastic container (5) having been degassed by the degassing unit, and a power source unit (8, 9) for applying a voltage between the outer electrode unit and the inner electrode (11) with a carbon source gas being fed into the container (5), thereby to generate plasma to form a DLC film on the inner surface of the plastic container (5), and in which the outer electrode unit comprises a first outer electrode (4) disposed along the bottom of the plastic container (5), a second outer electrode (3) disposed along the body of the plastic container (5), and a third outer electrode (2) disposed along the shoulder of the plastic container (5). This apparatus is hereinafter referred to as "apparatus with an outer electrode unit split in three sections". In this aspect of the invention, the outer electrode unit is split into the first outer electrode (4), the second outer electrode (3), and the third outer electrode (2), by which a suitable level of power can be applied to each site of the container to be coated. In the apparatus with an outer electrode unit split in three sections of the invention, preferably, the power source unit (8, 9) applies a higher power to the first outer electrode (4) than to the second outer electrode (3). In the preferred embodiment where a higher power is applied to the first outer electrode (4) than to the second outer electrode (3), a DLC film having a suitable thickness can be formed on the entire inner surface of the container (5).

The object of the invention is also attained by providing an apparatus for producing DLC film-coated plastic containers, which comprises an outer electrode unit disposed outside a plastic container (5), an inner electrode (11) disposed inside the plastic container (5), a degassing unit for reducing the inner pressure of the plastic container (5), a gas feeding unit (12, etc.) for feeding a raw material gas of a carbon source into the plastic container (5) having been degassed by the degassing unit, and a power source unit (8, 9) for applying a voltage between the outer electrode unit and the inner electrode (11) with a carbon source gas being fed into the container (5), thereby to generate plasma to form a DLC film on the inner surface of the plastic container (5), and in which the outer electrode unit comprises a first outer electrode disposed along the bottom of the plastic container (5), a second outer electrode disposed above the first outer electrode and along the outer periphery of the plastic container (5), and at least two other outer electrodes disposed above the second outer electrode and along the outer periphery of the plastic container (5). This apparatus is hereinafter referred to as "apparatus with an outer electrode unit split in plural sections". In the apparatus with an outer electrode unit split in plural sections of the invention, preferably, the power source unit (8, 9) applies a higher power to the first outer electrode than to the second outer electrode.

For producing DLC film-coated plastic containers, the invention provides a method that comprises disposing a first outer electrode outside a plastic container (5) along the bottom of the plastic container (5) and in such a manner that the upper edge of the first outer electrode is positioned below the center between the top and the bottom of the plastic container (5), disposing a second outer electrode outside the plastic container (5) and along the body of the plastic container (5), disposing an inner electrode (11) inside the plastic container (5), degassing the plastic container (5), then feeding a raw material gas of a carbon source into the plastic container (5), and applying a voltage between the first and second outer electrodes and the inner electrode (11) thereby to generate plasma to form a DLC film on the inner surface of the plastic container (5). In this method, preferably, a higher power is applied to the first outer electrode than to the second outer electrode.

For producing DLC film-coated plastic containers, the invention provides another method that comprises disposing a first outer electrode outside a plastic container (5) and along the bottom of the plastic container (5), disposing a second outer electrode outside the plastic container (5) and along the body of the plastic container (5), disposing a third outer electrode outside the plastic container (5) and along the shoulder of the plastic container (5), disposing an inner electrode (11) inside the plastic container (5), degassing the plastic container (5), then feeding a raw material gas of a carbon source into the plastic container (5), and applying a voltage between the first, second and third outer electrodes and the inner electrode (11) thereby to generate plasma to form a DLC film on the inner surface of the plastic container (5). In this method, preferably, a higher power is applied to the first outer electrode than to the second outer electrode.

For producing DLC film-coated plastic containers, the invention provides still another method that comprises disposing a first outer electrode outside a plastic container (5) and along the bottom of the plastic container (5), disposing a second outer electrode outside the plastic container (5) and above the first outer electrode, disposing at least two additional outer electrodes outside the plastic container (5) and above the second outer electrode, disposing an inner electrode (11) inside the plastic container (5), degassing the plastic container (5), then feeding a raw material gas of a carbon source into the plastic container (5), and applying a voltage between the first and second outer electrodes combined with at least two other outer electrodes above the second outer electrode, and the inner electrode (11) thereby to generate plasma to form a DLC film on the inner surface of the plastic container (5). In this method, preferably, a higher power is applied to the first outer electrode than to the second outer electrode.

The object of the invention is also attained by providing a DLC film to be formed on the surface of a plastic molding and having a thickness of from 50 to 400 Å, a hydrogen content of 39 to 52 hydrogen atomic % and a density of from 1.2 to 1.6 g/cm$^3$. In this aspect of the invention, the DLC film has a thickness of from 50 to 400 Å. In this, therefore, the oxygen transmission rate through the DLC film is effectively reduced, and the transparency of the DLC film-coated plastic molding is well prevented from being reduced owing to the discoloration of the DLC film. In addition, since the DLC film is prevented from being cracked owing to compression stress applied thereto, the oxygen barrier properties of the DLC film-coated plastic molding are well prevented from being degraded. Further, since the time for vapor deposition to form the DLC film is shortened, the productivity of the DLC film-coated plastic molding is improved.

More preferably, the DLC film thus defined by its thickness and/or its hydrogen content in the manner as above has a density of from 1.2 to 2.3 g/cm$^3$.

The object of the invention is also attained by providing a plastic container with its inner surface coated with DLC film formed thereon, in which the DLC film has a thickness of 50 to 400 Å, a hydrogen content of 39 to 50 hydrogen atomic % and a density of from 1.2 to 1.6 g/cm$^3$. In this aspect of the invention, the DLC film has a thickness of from 50 to 400 Å. In this, therefore, the oxygen transmission rate through the DLC film-coated plastic container is effectively reduced, and the transparency of the container is well prevented from being reduced owing to the discoloration of the DLC film. In addition, since the DLC film is prevented from being cracked owing to compression stress applied thereto, the oxygen barrier properties of the DLC film-coated plastic container are well prevented from being degraded. Further, since the time for vapor deposition to form the DLC film is shortened, the productivity of the DLC film-coated plastic container is improved.

For ensuring easy understanding of the present invention, the numeral references in the drawings attached hereto are referred to as parenthesized herein, which, however, are not to restrict the scope of the invention to only the embodiments illustrated by the drawings.

DESCRIPTION OF THE PREFERRED EMBODIMENTS

Figure 1:
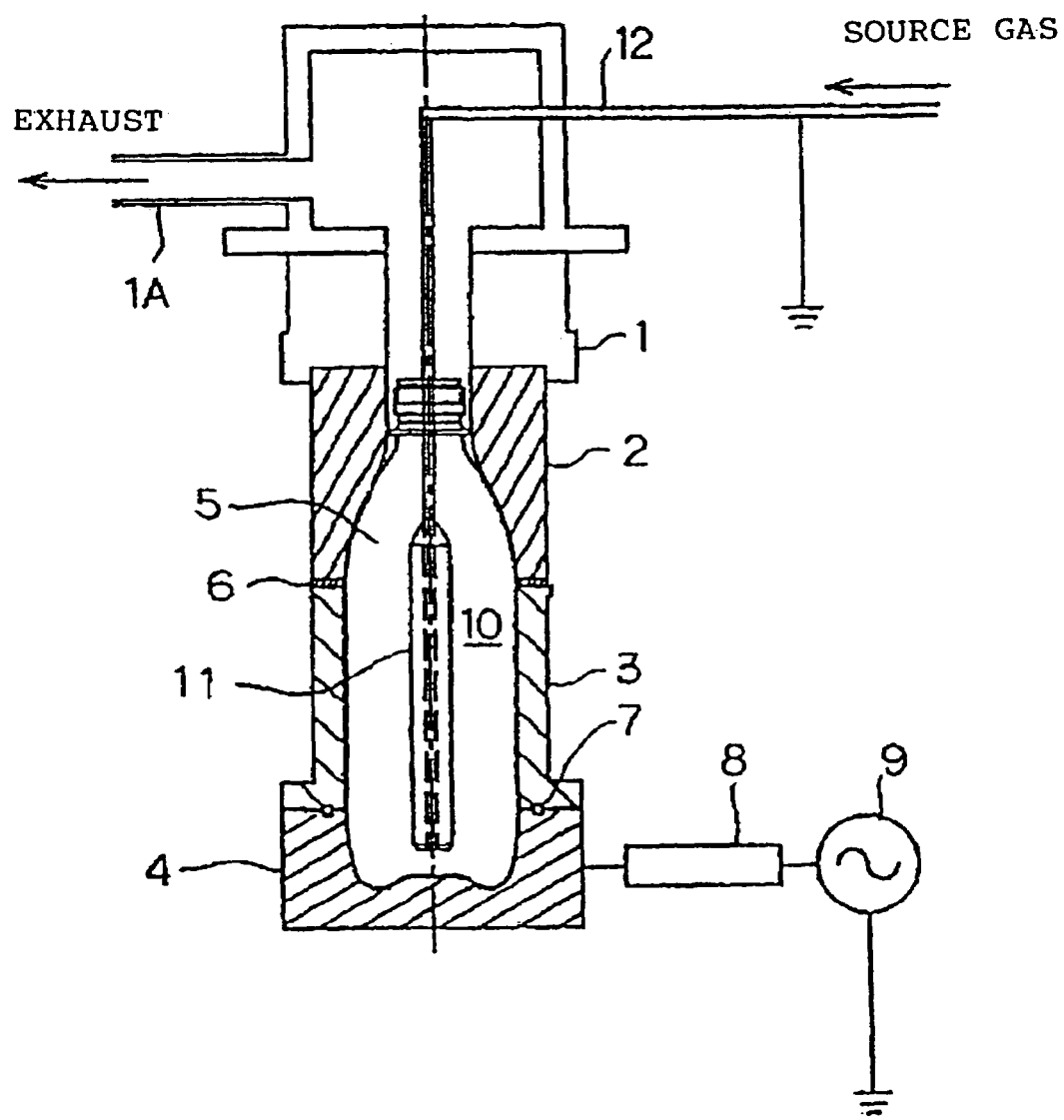
FIG. 1 is a schematic view showing one embodiment of the production apparatus of the invention.
Figure 2:
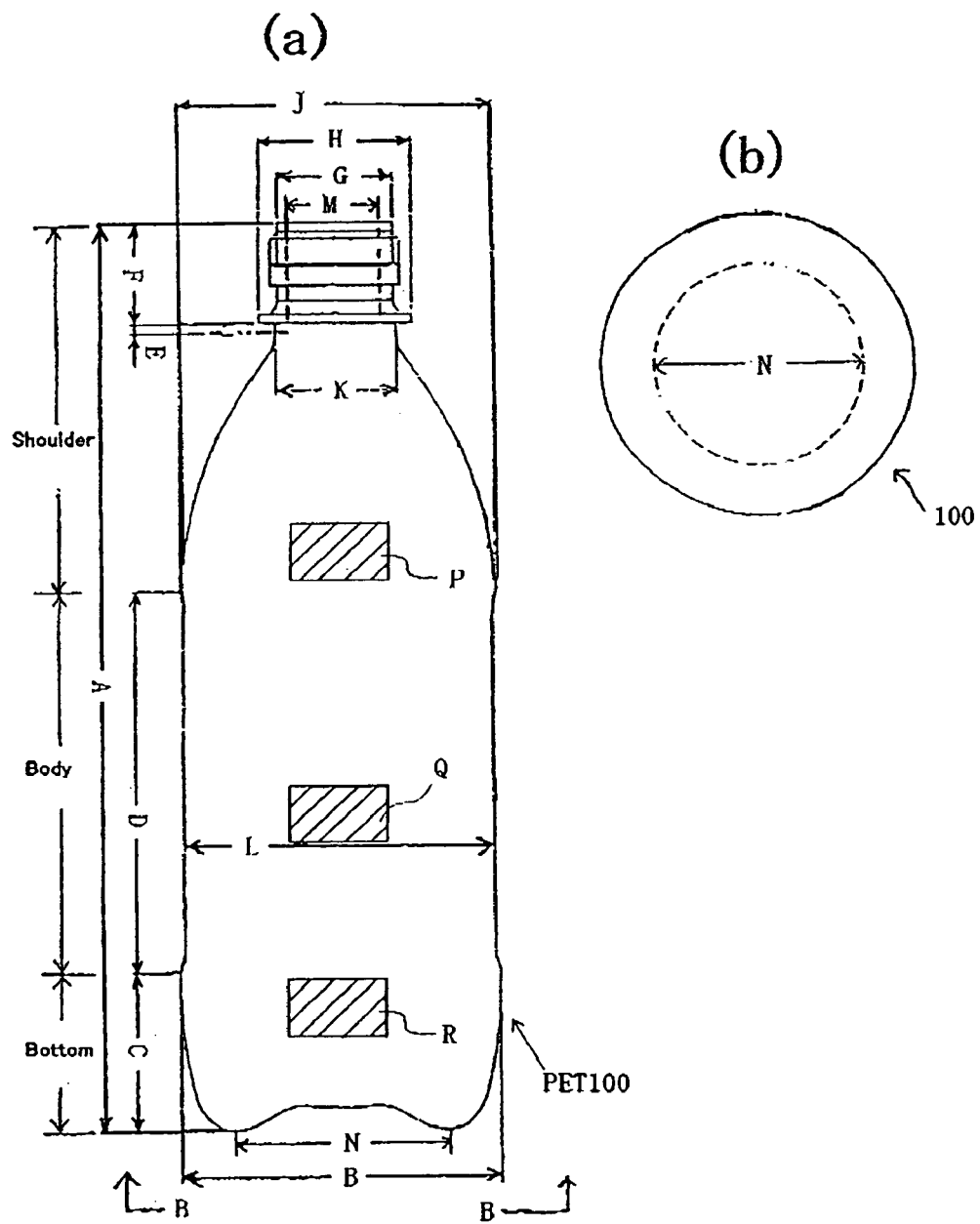
FIG. 2A and FIG. 2B are schematic views both showing one embodiment of the shape of a PET bottle, with FIG. 2A illustrating the front view of the bottle, and FIG. 2B illustrating the bottom view thereof seen in the direction of the line B—B in FIG. 2A.

With reference to FIG. 1, FIG. 2A, FIG. 2B, and Tables 1 to 7 given below, embodiments of the apparatus for forming and producing a DLC film and a DLC film-coated plastic container of the invention are described hereinunder.

FIG. 1 is a schematic view showing the apparatus of the invention, specifically the electrode constitution therein. As in FIG. 1, the apparatus comprises a stand 1; a shoulder electrode 2 fitted to the stand 1; a body electrode 3; and a bottom electrode 4 detachably fitted to the body electrode 3. As illustrated, the shoulder electrode 2, the body electrode 3 and the bottom electrode 4 each have an inner surface that corresponds to the outer shape profile of the plastic container 5. The shoulder electrode 2 is disposed along the shoulder of the plastic container 5; the body electrode 3 is along the body of the plastic container 5; and the bottom electrode 4 is along the bottom of the plastic container 5. The shoulder electrode 2, the body electrode 3 and the bottom electrode 4 constitute the outer electrode unit for the apparatus illustrated.

When the bottom electrode 4 is fitted to the body electrode 3, then the stand 1, the shoulder electrode 2, the body electrode 3 and the bottom electrode 4 shall form an airtightly closed system, which functions as a vacuum chamber having a housing space where the plastic container 5 is housed.

As in FIG. 1, an insulator 6 is interposed between the shoulder electrode 2 and the body electrode 3, and the shoulder electrode 2 is electrically insulated from the body electrode 3 via the insulator 6. An O-ring 7 is interposed between the body electrode 3 and the bottom electrode 4. When the bottom electrode 4 is fitted to the body electrode 3 via the O-ring 7 therebetween, the O-ring 7 forms a slight gap between the bottom electrode 4 and the body electrode 3.

In that manner, the bottom electrode 4 is airtightly fitted to the body electrode 3, while being electrically insulated from it.

In the housing space 10, disposed is an inner electrode 11. The inner electrode 11 is inserted into the plastic container 5 housed in the housing space 10. The inner electrode 11 is electrically connected to the ground potential.

The inner electrode 11 is formed to have a hollow (cylindrical) shape. At the lower end of the inner electrode 11, formed is one through-hole (not shown) via which the inside of the inner electrode 11 communicates with the outside thereof. In place of disposing one through-hole at the lower end of the inner electrode 11, a plurality of through-holes (not shown) may be formed around the inner electrode 11, via which the inside of the inner electrode 11 radially communicates with the outside thereof. A duct 12 is inserted into the inner electrode 11. A raw material gas fed into the inner electrode 11 via the duct 12 is led into the plastic container 5 via the through-hole(s). The duct 12 is made of metal and has electroconductivity. As in FIG. 1, the inner electrode 11 is connected to the ground potential via the duct 12. The inner electrode 11 is supported by the duct 12.

As in FIG. 1, the bottom electrode 4 is connected to the output terminal of a high-frequency oscillator via a matching transformer 8 disposed therebetween. The high-frequency oscillator 9 generates a high-frequency voltage between it and the ground potential. According to this, the high-frequency voltage thus generated is imparted between the inner electrode 11 and the bottom electrode 4. The high-frequency power source is for 13.56 MHz, and the same shall apply hereinunder.

The process of forming a DLC film on the inner surface of the plastic container 5 by the use of the apparatus is described.

The plastic container 5 is so disposed that its bottom is kept in contact with the inner surface of the bottom electrode 4. With the bottom electrode 4 ascending, the plastic container 5 is housed in the housing space 10. In this condition, the inner electrode 11 disposed in the housing space 10 is inserted into the plastic container 5 through the mouth (opening in the upper end) of the plastic container 5.

After the bottom electrode 4 has ascended to a predetermined level to close the housing space 10, the outer periphery of the plastic container 5 is kept in contact with the inner surface of the shoulder electrode 2, the body electrode 3 and the bottom electrode 4. Next, the closed housing space 10 is degassed via the exhaust outlet 1A formed through the stand 1, by the use of a degassing unit (not shown). In that manner, the closed housing space 10 is degassed until the vacuum degree therein reaches the necessary level. Next, a raw material gas (for example, a carbon source gas of aliphatic hydrocarbons, aromatic hydrocarbon, etc.) fed via the duct 12 is introduced into the plastic container 5 through the through-hole(s) of the inner electrode 11.

After the concentration of the raw material gas in the plastic container 5 has reached a predetermined level, the high-frequency oscillator 9 is driven to thereby impart a high-frequency voltage between the inner electrode 11 and the outer electrode unit, and plasma is generated in the plastic container 5. Through the process, a DLC film is formed on the inner surface of the plastic container 5.

As in the manner as above, the DLC film is formed on the inner surface of the plastic container 5 through plasma CVD.

Owing to the plasma formed between the outer electrode unit and the inner electrode 11, electrons deposit on the inner surface of the insulated outer electrode unit, thereby causing potential depression to a predetermined level. As a result, the carbon and hydrogen atoms constituting the hydrocarbon of the raw material gas that exists in the plasma are ionized to be cations. The cations collide at random against the inner surface of the plastic container 5 that runs along the inner surface of the outer electrode unit. In that condition, the neighboring carbon atoms, or the neighboring carbon and hydrogen atoms bond to each other, or the hydrogen atoms having once bonded to carbon atoms separate from them through sputtering. As a result of the process, a DLC film of extremely dense DLC is formed on the inner surface of the plastic container 5.

As so mentioned hereinabove, the output terminal of the high-frequency oscillator 9 is connected to only the bottom electrode 4 via the matching transformer 8. In addition, a gap is formed between the bottom electrode 4 and the body electrode 3, and the bottom electrode 4 is electrically insulated from the body electrode via the gap. Further, the insulator 6 is interposed between the body electrode 3 and the shoulder electrode 2, and the body electrode 3 is electrically insulated from the shoulder electrode 2 via the insulator 6. Accordingly, the high-frequency power to be applied to the body electrode 3 and the shoulder electrode 2 shall be smaller than that to be applied to the bottom electrode 4. However, since the bottom electrode 4 and the body electrode 3, and also the body electrode 3 and the shoulder electrode 2 are in capacitive coupling between them via the gap therebetween, some degree of high-frequency power is applied also to the body electrode 3 and to the shoulder electrode 2.

In general, the bottom of plastic containers such as bottles and others has a complicated profile, on which, therefore, a DLC film having a satisfactory thickness is difficult to form. Owing to the production problem, the bottom of plastic containers is often oriented to an unsatisfactory degree, and its gas barrier properties are often poor. Accordingly, even after a DLC film has been formed on the inner surface of plastic containers, the gas barrier properties of the bottom of the containers are often still poor.

Our experiments carried out for forming a DLC film on the inner surface of a plastic bottle, a type of plastic containers, with applying the same high-frequency power to the entire outer electrode unit composed of the shoulder electrode 2, the body electrode 3 and the bottom electrode 4 revealed that the DLC film formed on the inner surface area from the mouth to the shoulder of the plastic bottle was thick while that formed around the shoulder thereof was relatively thin and that formed on the bottom thereof was extremely thin. The gas barrier properties of the DLC film-coated bottle are significantly poor as a whole since the gas barrier properties of the bottom of the non-coated bottle itself are naturally poor, as so mentioned hereinabove. In order to ensure the DLC film entirely having a satisfactory thickness, the time for the coating operation will be prolonged to 20 to 30 seconds, which, however, increases the production costs. Another problem in the tested process is that, in the area coated with such a thick DLC film, the DLC film is easy to peel off. Still another problem is that the bottles being coated with the DLC film are often deformed during the prolonged coating time or by the increased high-frequency power, and the deformed bottles are no more in practical use. We have found that the suitable high-frequency power to be applied falls between 400 and 500 W or so.

In addition, in the tested process, the adhesiveness of the DLC film to the inner surface of the coated containers was low, and the density of the DLC film formed was low.

Anyhow, in case where a uniform high-frequency power is applied to the entire outer electrode unit as in the tested process, the gas barrier properties of the coated plastic bottles could be improved only by about 2 to 6 times those of the non-coated ones.

As opposed to this, in the production apparatus of the embodiment mentioned above, a larger high-frequency power can be applied to the bottom of the plastic container than to the body and the shoulder thereof, and therefore a uniform DLC film can be formed on the entire inner surface of the bottle. In addition, a thicker DLC film can be formed on the inner surface of the bottom of the plastic container of which the gas barrier properties are naturally poor. Accordingly, the DLC film-coated plastic container thus produced can have effectively improved gas barrier properties as a whole of the container. In the embodiment mentioned above, the power to be applied can be increased to 1200 to 1400 W. Accordingly, the coating time could be shortened and the production costs could be reduced.

In the embodiment mentioned above, the high-frequency power to be applied to the area around the mouth of the container and that around the shoulder thereof can be lowered while that to be applied to the area around the bottom of the container can be increased to a satisfactory degree. In that condition, therefore, the plastic containers being coated are prevented from being deformed. Other advantages are that a dense DLC film can be formed in the embodiment and the adhesiveness of the thus formed DLC film to the inner surface of the plastic container is high.

In the embodiment mentioned above, the shoulder electrode 2, the body electrode 3 and the bottom electrode 4 are so constructed in a series that they are completely insulated from each other for a direct current to be applied thereto, but the illustrated construction of the outer electrode unit disposition is not limitative. As the case may be, the electrodes may be connected to each other via resistive or capacitive elements or the like there between. In short, the necessary level of high frequency power shall be applied to each outer electrode, depending on the parts of the container to be coated.

In the embodiment mentioned above, the outer electrode unit is split into three sections. Apart from this, the outer electrode unit may be split into three sections, or even into four or more sections.

In the embodiment mentioned above, the container to be coated has a bottom profile that is hardly coated with a DLC film, which, however, is not limitative. Naturally, the high-frequency power distribution to be applied to containers can be properly controlled, depending on the shape of the containers, whereby a good DLC film can be formed uniformly on the entire inner surface of the containers.

In the production apparatus of the invention, plastic containers suitable to returnable applications can be produced, which, however, are not limitative. Needless-to-say, the plastic containers produced in the apparatus can be for one-way applications as disposable containers (that is, the containers packed and used once are not recovered but are discarded).

The invention is described in more detail with reference to the following Examples, which, however, are not intended to restrict the scope of the invention.

EXAMPLES

Example 1

This is to demonstrate the formation of a DLC film on the inner surface of 500 ml PET (polyethylene terephthalate) bottles by the use of the apparatus mentioned above under different conditions mentioned below. The coated bottles were tested for their properties, and the data obtained are given below.

Table 1 shows the condition for plasma CVD employed herein, and the dimension and the shape of the PET bottles and others coated herein. Table 2 shows the methods for testing and evaluating the bottles of which the inner surface was coated with a DLC film. Table 3 shows the film-forming conditions for which toluene was used as the raw material gas, and the test data of the coated bottles. Table 4 shows the film-forming conditions for which acetylene was used as the raw material gas, and the test data of the coated bottles.

TABLE 1A

Condition for Plasma CVD (1) High-frequency Power: 500 to 1500 W.
(2) Vacuum Degree: 0.01 to 0.07 Torr.
(3) Gas Flow Rate: 1.7 to 31 cc/min.
(4) Raw Material Gas: toluene, acetylene.
(5) Plasma Stability: evaluated according to the following three-rank criteria.
  ○: Plasma formed was kept stable.
  Δ: Plasma formed was unstable, but was enough to form samples.
  x: No plasma was formed.
(6) Filming Time: 6 to 40 seconds.
(7) Method of Discharging Outer electrode Unit:
  <1> to the whole.
  <2> only to the body and the bottom.
  <3> only to the bottom.

TABLE 1B

Dimension of Plastic Bottles

| Height | 500 ml PET bottle, 32 g, wall thickness 0.4 mm | 700 ml PET bottle, 62 g, wall thickness 0.6 mm | 500 ml PP bottle, 36 g, wall thickness 0.8 mm |
|---|---|---|---|
| Mouth (mm) | 22.4 | 24.5 | 29.0 |
| Shoulder (mm) | 62.1 | 175.0 | 104.5 |
| Body (mm) | 92.0 | | |
| Bottom (mm) | 30.5 | 30.5 | 30.5 |
| Total Height (mm) | 207.0 | 230.0 | 164.0 |
| bottom/(shoulder + body + bottom), % | 16.5 | 14.8 | 22.6 |

TABLE 2

Test Methods

| | |
|---|---|
| (1) Appearance Evaluation: | DLC films formed are transparent and brownish. DLC film-coated bottles are macroscopically checked for the color density and the film thickness uniformity, and are ranked in three ranks, ○, Δ and x. |
| (2) Bottle Deformation: | Bottles coated with a large high-frequency power applied thereto and for a long period of time for exposure to plasma are deformed by the heat of plasma. Based on the degree of deformation, the coated bottles are ranked in three ranks, ○, Δ and x. |
| (3) Oxygen Transmission Rate: | Measured with Modern Control's Oxtran, at 22° C., 60% RH. |

TABLE 3

(raw material gas: toluene)

| | Condition | | | | | Test Results | | |
|---|---|---|---|---|---|---|---|---|
| Discharging Method | High-Frequency Power (W) | Vacuum Degree (Torr) | Gas Flow Rate (cc/min) | Plasma Stability | Period for Exposure to Plasma (sec) | Appearances | Bottle Deformation | Oxygen Transmission Rate (ml/day/bottle) |
| Control | — | — | — | — | — | — | ○ | 0.033 |
| Whole | 400 | 0.03 | 6.3 | x | 10 | x | ○ | 0.029 |
| Whole | 500 | 0.02 | 3.7 | x–Δ | 10 | x | ○ | 0.022 |
| Whole | 500 | 0.03 | 3.8 | x–Δ | 10 | x | ○ | 0.022 |
| Whole | 800 | 0.03 | 3.8 | Δ–○ | 10 | x | Δ | 0.020 |
| Whole | 1000 | — | — | x | — | — | — | — |
| Bottom, Body | 300 | 0.03 | 6.3 | x | 40 | x | Δ | 0.031 |
| Bottom, Body | 700 | 0.03 | 6.3 | x–Δ | 10 | x | ○ | 0.026 |
| Bottom, Body | 1000 | 0.03 | 6.3 | Δ–○ | 10 | Δ | Δ | 0.006 |
| Bottom, Body | 1300 | — | — | x | — | — | — | — |
| Bottom | 500 | 0.02 | 2.7 | x–Δ | 30 | x | ○ | 0.022 |
| Bottom | 800 | 0.03 | 5.6 | x–Δ | 15 | Δ | ○ | 0.023 |
| Bottom | 1000 | 0.03 | 6.4 | Δ–○ | 10 | Δ | ○ | 0.018 |
| Bottom | 1000 | 0.02 | 4.6 | Δ–○ | 12 | Δ | ○ | 0.010 |
| Bottom | 1200 | 0.02 | 2.7 | ○ | 10 | ○ | ○ | 0.004 |
| Bottom | 1200 | 0.02 | 4.6 | ○ | 10 | ○ | ○ | 0.004 |
| Bottom | 1300 | 0.02 | 2.7 | ○ | 8 | ○ | ○ | 0.004 |
| Bottom | 1400 | 0.01 | 1.7 | Δ–○ | 6 | ○ | ○ | 0.007 |
| Bottom | 1500 | 0.03 | 6.4 | x–Δ | 7 | Δ | Δ | 0.006 |

TABLE 4

(raw material gas: acetylene)

| | Condition | | | | | Test Results | | |
|---|---|---|---|---|---|---|---|---|
| Discharging Method | High-Frequency Power (W) | Vacuum Degree (Torr) | Gas Flow Rate (cc/min) | Plasma Stability | Period for Exposure to Plasma (sec) | Appearances | Bottle Deformation | Oxygen Transmission Rate (ml/day/bottle) |
| Control | — | — | — | — | — | — | ○ | 0.033 |
| Whole | 500 | 0.05 | 31 | Δ–○ | 15 | x | ○ | 0.021 |
| Whole | 800 | 0.05 | 31 | x–Δ | 8 | x | ○ | 0.016 |
| Whole | 1000 | — | — | x | — | — | ○ | — |
| Bottom, Body | 500 | 0.05 | 31 | Δ–○ | 15 | x | ○ | 0.018 |
| Bottom, Body | 800 | 0.05 | 31 | ○ | 10 | Δ | Δ | 0.009 |
| Bottom, Body | 1000 | 0.05 | 31 | Δ–○ | 7 | Δ | ○ | 0.005 |
| Bottom, Body | 1500 | — | — | x | — | — | ○ | — |
| Bottom | 500 | 0.07 | 31 | x–Δ | 20 | x | ○ | 0.017 |
| Bottom | 800 | 0.06 | 31 | x–Δ | 15 | Δ | ○ | 0.012 |
| Bottom | 1000 | 0.05 | 31 | ○ | 10 | ○ | ○ | 0.002 |
| Bottom | 1500 | 0.05 | 31 | ○ | 8 | ○ | Δ | 0.005 |
| Bottom | 2000 | 0.05 | 31 | Δ–○ | 6 | ○ | Δ | 0.006 |

In Table 1B showing the dimension of plastic bottles, the "bottom/(shoulder+body+bottom)" indicates the ratio of the height of the bottom, which faces the bottom electrode 4, to the total height of the bottle. Precisely, it indicates the value obtained by dividing the "length from the bottom of the bottle to the top edge of the bottom electrode 4" by the "total height of the bottle (that is, the length from the bottom to the top edge of the bottle)", in terms of percentage.

In Table 1B showing the dimension of plastic bottles, "700 ml PET bottle" and "500 ml PP (polypropylene) bottle" were prepared for testing them. In the columns of these bottles, the dimensions of the bottles and the site of the bottom electrode applied to the bottles correspond to those in the column of "500 ml PET bottle". The data in Table 3 and Table 3 are of the 500 ml PET bottles tested under the film-forming conditions indicated therein.

In "(7) Method of Discharging Outer Electrode Unit" in Table 1A, the case of "<1> to the whole" is such that the shoulder electrode 2, the body electrode 3 and the bottom electrode 4 are all electrically short-circuited to each other and the same high-frequency power is applied to all these electrodes at the same time. The case of "<2> only to the body and the bottom" is such that the body electrode 3 and the bottom electrode 4 are both electrically short-circuited to each other while the shoulder electrode 2 is insulated from the body electrode 3, and the same high-frequency power is applied to both the body electrode 3 and the bottom electrode 4 at the same time. The case of "<3> only to the bottom" is the method of the present invention, for which the shoulder electrode 2, the body electrode 3 and the bottom electrode 4 are all electrically insulated from each other, and the high-frequency power is applied to only the bottom electrode 4. These discharging methods are in the column of "Discharging Method" in Table 3 and Table 4.

In Table 2 indicating the details of "(1) Appearance Evaluation" and "(2) Bottle Deformation", "O" means the best and "x" means the worst. The test results are in the corresponding columns in Table 3 and Table 4. From the data given in Table 3 and the Table 4, it is obvious that the discharging method "only to the bottom" is better than the other discharging methods.

Example 2

This is to demonstrate the formation of a thinner DLC film on the inner surface of 500 ml PET (polyethylene terephthalate) bottles than in Example 1, under different film-forming conditions as in Table 5 below, for which is used the apparatus mentioned above. The coated bottles were tested and the test data obtained are given in Table 5.

In Example 2, the period for exposure to plasma is relatively shortened, and therefore the DLC film formed is thin.

TABLE 5

| Test No. | Period for Exposure to Plasma (sec) | Film Thickness (Å) | Oxygen Transmission Rate (ml/day/bottle) |
|---|---|---|---|
| 1 | 0 | 0 | 0.033 |
| 2 | 2 | 50–75 | 0.008 |
| 3 | 4 | 90–160 | 0.007 |
| 4 | 6 | 150–230 | 0.004–0.006 |
| 5 | 8 | 200–300 | 0.004 |
| 6 | 10 | 250–380 | 0.003–0.004 |

The condition for exposure to plasma in Tests Nos. 1 to 6 is as follows: Acetylene was used as the raw material gas. For discharging, a high-frequency power was applied to only the bottom electrode 4. Precisely, the shoulder electrode 2, the body electrode 3 and the bottom electrode 4 were electrically insulated from each other, and a high-frequency power was applied to only the bottom electrode 4. The high-frequency power was 1300 W; the vacuum degree was 0.05 Torr (6.66 Pa); and the gas flow rate was 31 ml/min. Test No. 1 is a control, non-coated PET bottle.

Table 5 shows the period for exposure to plasma, the thickness of the DLC film formed, and the oxygen transmission rate through the film in Tests Nos. 1 to 6. FIG. 2A and FIG. 2B are schematic views showing the shape of the PET bottle used in the tests herein.

In FIGS. 2A and 2B, the PET bottle 100 has a height, A, of 207 mm, which is the length from the top to the bottom of the bottle 100. In FIGS. 2A and 2B, the dimensions of the other parts of the bottle are as follows: B=68.5 mm, C=34.5 mm, D=88 mm, E=2 mm, F=22.43 mm, G=24.94 mm, H=33 mm, J=67.7 mm, K=26.16 mm, L=66.5 mm, M=21.4 mm, N=46 mm. The thickness of the wall of the PET bottle 100 is 0.4 mm.

The thickness of the DLC film formed on the inner surface of the shoulder, the body and the bottom of the PET bottle 100 was measured. In Table 5, the data of the DLC film thickness indicate the range between the lowest value and the highest value measured.

Example 3

A DLC film was formed on the inner surface of 500 ml PET bottles by the use of the apparatus mentioned above. The details of the film-forming condition employed herein are given in Table 6. The DLC film-coated bottles were tested and the test data are in Table 6. With reference to the data in Table 6, the coated bottles are discussed in point of the density of the DLC film.

TABLE 6

| Test No. | Discharging Method | High-Frequency Power Applied | Part of Bottle | Thickness Å | Volume $10^{-3}$ cm$^3$ | Weight mg | Density g/cm$^3$ | Oxygen Transmission Rate ml/day/bottle |
|---|---|---|---|---|---|---|---|---|
| 7 | whole | 800 W | shoulder | 318 | 0.387 | 0.727 | 1.88 | — |
|   |       |       | body     | 213 | 0.393 | 0.578 | 1.47 |   |
|   |       |       | bottom   | 257 | 0.249 | 0.336 | 1.35 |   |
| 8 | whole | 1200 W | shoulder | 432 | 0.526 | 0.737 | 1.40 | — |
|   |       |        | body     | 232 | 0.429 | 0.627 | 1.46 |   |
|   |       |        | bottom   | 292 | 0.283 | 0.393 | 1.39 |   |
| 9 | bottom | 800 W | shoulder | 277 | 0.377 | 0.788 | 2.09 | 0.003 |
|   |        |       | body     | 219 | 0.405 | 0.493 | 1.22 |   |
|   |        |       | bottom   | 215 | 0.209 | 0.334 | 1.59 |   |
| 10 | bottom | 1200 W | shoulder | 301 | 0.367 | 0.847 | 2.30 | 0.003 |
|    |        |        | body     | 197 | 0.364 | 0.730 | 2.01 |   |
|    |        |        | bottom   | 304 | 0.295 | 0.437 | 1.48 |   |

As in Table 5, the oxygen transmission rate through the control, non-coated PET bottle in Test No. 1 is 0.033 ml/day/bottle, while that through the PET bottle in Test No. 2, which has a DLC film of from 50 to 75 Å thick on its inner surface, is 0.008 ml/day/bottle. From this, it is understood that the oxygen transmission rate through the bottle with such a thin DLC film of from 50 to 75 Å or so in thickness formed on its inner surface is reduced to about ¼ or so of that through the non-coated bottle. As in Table 5, it is understood that the oxygen transmission rate through the PET bottles in Tests Nos. 3 to 6 with a thicker DLC film formed on their inner surface is further reduced. The data obtained herein support the effective reduction in the oxygen transmission rate through the DLC film-coated PET bottles in which the thickness of the DLC film is relatively small, falling between 50 and 400 Å or so.

The PET bottles of Tests Nos. 2 to 6 each having a thin DLC film formed on the inner surface have the following advantages: The first is that the bottles could be transparent. In general, DLC films look pale yellow, but look black when too thick. Therefore, bottles with their inner surface coated with such a thick DLC film shall lose transparency. The second is that the thin DLC film formed on the inner surface of the bottles is hardly cracked. Contrary to this, thick DLC films will receive large compression stress and will be readily cracked, and the oxygen barrier properties of bottles of which the inner surface is coated with such a cracked DLC film will be not good. The third is that the time for vapor deposition to form such a thin DLC film is short, and the productivity of the DLC film-coated bottles is high.

The oxygen transmission rate through the DLC film-coated bottles shown in Table 5 was measured by the use of Modern Control's Oxtran, at 22° C. and 60% RH. The thickness of the DLC film was measured by the use of a profilometer, Tenchol's Alpha-step 500.

The condition for exposure to plasma in Tests Nos. 7 to 10 is as follows: Acetylene was used as the raw material gas. For discharging, the high-frequency power as in Table 6 was applied to only the bottom electrode 4. Precisely, the shoulder electrode 2, the body electrode 3 and the bottom electrode 4 were electrically insulated from each other, and the high-frequency power was applied to only the bottom electrode 4. The vacuum degree was 0.05 Torr (6.66 Pa); the gas flow rate was 31 ml/min; and the time for exposure to plasma was 8 seconds.

The data of the density of the DLC film formed are given in Table 6. In the column of "Discharging Method" in Table 6, the case of "whole" is such that the shoulder electrode 2, the body electrode 3 and the bottom electrode 4 are all electrically short-circuited to each other and the same high-frequency power is applied to all these electrodes at the same time (Tests Nos. 7 and 8). The case of "bottom" is such that the shoulder electrode 2, the body electrode 3 and the bottom electrode 4 are all electrically insulated from each other, and the high-frequency power is applied to only the bottom electrode 4 (Tests Nos. 9 and 10).

The column of "High-Frequency Power Applied" indicates the high-frequency power applied in each Test. In Table 6, given are the thickness, the volume, the weight and the density of the DLC film formed on the inner surface of each part of shoulder, body and bottom of the PET bottle in each Test. The part of the PET bottle corresponds to the expression of "shoulder", "body" and "bottom" in the column of "Part of Bottle" in Table 6.

The oxygen transmission rate through the DLC film-coated bottles shown in Table 6 was measured by the use of Modern Control's Oxtran, at 22° C. and 60% RH. The thickness of the DLC film was measured by the use of a profilometer, Tenchol's Alpha-step 500. The surface area of the PET bottle was calculated through CAD, based on the drawing of the PET bottle.

To measure the weight of the DLC film, the film-coated PET bottle 100 was divided into three parts, shoulder, body and bottom. Next, each part was immersed in an aqueous solution of 4% NaOH in a beaker, and reacted at room temperature for 10 to 12 hours or so, whereby the DLC film was peeled. Next, the solution was filtered through a milli-pore filter of polytetrafluoroethylene (pore size: 0.5 µm), and the deposit remaining on the filter was dried at 105° C. The weight of the milli-pore filter with the dry deposit thereon was measured. The weight of the milli-pore filter alone was subtracted from the thus measured weight to obtain the weight of the peeled DLC film alone. Since the NaOH solution used herein contains an impurity residue, the blank value of the NaOH solution alone was obtained. Based on the blank value, the weight of the DLC film was corrected.

The density of the DLC film was obtained according to the following formula (1):

$$\text{Density} = \text{weight}/(\text{surface area} \times \text{thickness}) \quad (1)$$

As in Table 6, there is found no significant difference in the density if the DLC films formed on different parts, depending on the high-frequency power applied and on the parts of the PET bottle, and the density of the DLC films falls between 1.2 and 2.3 g/cm$^3$.

Example 4

A DLC film was formed on the inner surface of 500 ml PET bottles by the use of the apparatus mentioned above. The DLC film-coated bottles were tested and the test data are in Table 7. With reference to the data in Table 7, the coated bottles are discussed in point of the hydrogen content of the DLC film.

TABLE 7

(unit: hydrogen atomic %)

| Test No. | High-Frequency Power Applied | Part of Bottle | Density (g/cm$^3$) | | |
|---|---|---|---|---|---|
| | | | 1.2 | 1.8 | 2.3 |
| 11 | discharging at bottom 800 W | shoulder | 28.6 | 26.3 | 25.1 |
| | | body | 18.6 | 17.2 | 16.1 |
| | | bottom | 27.4 | 25.5 | 24.1 |
| 12 | discharging at bottom 1200 W | shoulder | 51.9 | 49.3 | — |
| | | body | 50.2 | 47.1 | — |
| | | bottom | 39.1 | 37.2 | 35.8 |

In Tests Nos. 11 and 12, a glass substrate (length: 23 mm, width: 19 mm, thickness: 0.5 mm) was fitted to a predetermined region of the shoulder, the body and the bottom of the PET bottles. Since PET contains hydrogen, the hydrogen content of PET itself will bring about an error in the data of the hydrogen content of the DLC film to be measured herein. To evade the error, the glass substrate was used herein in measuring the hydrogen content of the DLC film formed on the PET bottles. The glass substrate was fitted to each part of the bottle via the metal plug fixed to the outer electrode unit.

In FIG. 2A, "P" indicates the upper region of the shoulder; "Q" indicates the middle region of the body; and "R" indicates the lower region of the bottom. The lower edge of the shoulder region P is spaced upward by 125 mm from the bottom of the PET bottle; and the upper edge of the shoulder region P is spaced upward by 144 mm from the bottom of the PET bottle. The lower edge of the body region Q is spaced upward by 65 mm from the bottom of the PET bottle; and the upper edge of the body region Q is spaced upward by 84 mm from the bottom of the PET bottle. The lower edge of the bottom region R is spaced upward by 11 mm from the bottom of the PET bottle; and the upper edge of the bottom region R is spaced upward by 30 mm from the bottom of the PET bottle.

To produce plasma, acetylene was used as the raw material gas in Tests Nos. 11 and 12, in which the plasma discharging was applied to the bottom of the bottles. Precisely, in these, the shoulder electrode 2, the body electrode 3 and the bottom electrode 4 were all electrically insulated from each other, and the predetermined high-frequency power was applied to only the bottom electrode 4. The vacuum degree was 0.05 Torr (6.66 Pa); and the gas flow rate was 31 ml/min. In Test No. 11, the high-frequency power was 800 W; and in Test No. 12, it was 1200 W.

Table 7 shows the data of the hydrogen content of the DLC film formed on the glass substrate fitted to the shoulder region P, the body region Q and the bottom region R of the PET bottle. In Table 7, the "shoulder", "body" and "bottom" in the column of "Part of Container" indicate the shoulder region P, the body region Q and the bottom region R, respectively, of the PET bottle.

As in Table 6, the density of DLC films varies within the range falling between 1.22 and 2.30 g/cm$^3$. Therefore, the hydrogen content of the DLC film formed herein was measured in different parts of the film having a density of 1.2, 1.8 and 2.3 g/cm$^3$.

To determine the hydrogen content of the DLC films, the hydrogen concentration % (the proportion of the number of hydrogen atoms) in each DLC film was measured through elastic recoil detection analysis, for which was used an analyzer, Shimadzu's IBA-9900 EREA.

As in Table 7, the hydrogen content of the DLC films increases with the increase in the high-frequency power applied. In addition, it is seen that the hydrogen content of the DLC films decreases in some degree with the increase in the density of the films.

In the embodiment mentioned above, the plasma was generated by the high-frequency power applied to the outer electrode unit, to thereby form DLC films. However, the method of forming DLC films in the invention is not limited to the illustrated case. For example, the plasma for forming DLC films may be generated by microwave discharging.

Not limited to PET or PP containers as in the illustrated embodiment, the DLC films of the invention are applicable to various plastic containers with no limitation. Needless-to-say, the DLC films are applicable to any others than containers.

The "DLC film-coated plastic containers" referred to herein are meant to indicate plastic containers coated with a DLC film.

While the invention has been described in detail and with reference to specific embodiments thereof, it will be apparent to one skilled in the art that various changes and modifications can be made therein without departing from the spirit and scope thereof.

What is claimed is:

1. An apparatus for producing DLC film-coated plastic containers having a bottom portion, a body portion which is located above said bottom portion, and a shoulder portion which is located above said body portion, comprising
   an outer electrode unit disposed outside a plastic container,
   an inner electrode disposed inside said plastic container, a vacuum unit for reducing the inner pressure of the plastic container, a gas feeding unit for feeding a raw material gas of a carbon source into said plastic container which has been placed under a vacuum by said vacuum unit, and a power source unit for applying a voltage between the outer electrode unit and the inner electrode while a carbon source gas is fed into the container, thereby to generate plasma to form a DLC film on an inner surface of the plastic container;

wherein the outer electrode unit comprises a first outer electrode disposed along the bottom portion of the plastic container, a second outer electrode disposed along the body portion of the plastic container, and a third outer electrode disposed along the shoulder portion of the plastic container, resistive element or capacitive elements are interposed between each of the outer electrodes, to prevent the flow of direct electric current and seal the outer electrodes, and an output terminal of a high frequency oscillator is connected to only the first outer electrode via a matching transformer.

2. An apparatus for producing DLC film-coated plastic containers having, a bottom portion, a body portion which is located above said bottom portion, and a shoulder portion which is located above said body portion comprising an outer electrode unit disposed outside a plastic container, an inner electrode disposed inside the plastic container, a vacuum unit for reducing the inner pressure of the plastic container, a gas feeding unit for feeding a raw material gas of a carbon source into the plastic container which has been placed under a vacuum by said vacuum unit, and a power source unit for applying a voltage between the outer electrode unit and the inner electrode while a carbon source gas is fed to the container, thereby to generate plasma to form a DLC film on an inner surface of the plastic container;

wherein the outer electrode unit comprises a first outer electrode disposed along the bottom portion of the plastic container, a second outer electrode disposed above the first outer electrode and outside of the plastic container, and at least two other outer electrodes disposed above the second outer electrode and outside of the plastic container, resistive or capacitive elements are interposed between each of the outer electrodes, to prevent the flow of direct electric current and seal the outer electrodes, and an output terminal of a high frequency oscillator is connected to only the first outer electrode via a matching transformer.

3. The apparatus for producing DLC film-coated plastic containers as claimed in claims 1 or 2, wherein the high-frequency electric power is imparted to the second outer electrode by capacitive coupling.

4. The apparatus for producing DLC film-coated plastic containers as claimed in claims 1 or 2, wherein the high-frequency electric power is imparted to the outer electrodes other than the first outer electrode by capacitive coupling.

5. The apparatus for producing DLC film-coated plastic containers as claimed in claims 1 or 2 wherein resistive or capacitive elements are formed to have a thickness through which the high-frequency electric power is able to be imparted to the outer electrode other than the first outer electrodes by capacitive coupling.

6. A method for producing DLC film-coated plastic containers having a bottom portion, a body portion which is located above said bottom portion, and a shoulder portion which is located above said body portion, comprising the steps of:

disposing a first outer electrode, having an upper edge, outside a plastic container and at the bottom of the plastic container where it extends upwardly along sides of said plastic container in such a manner that said upper edge of the first outer electrode is positioned between the top and the bottom of the plastic container;

disposing a second outer electrode outside the plastic container and extending upwardly along the body of said plastic container, interposing a resistive or capacitive element, which also serves as a sealing material, between the first outer electrode and the second outer electrode to prevent the flow of direct electric current;

disposing an inner electrode inside the plastic container and then creating a vacuum inside the plastic container, then feeding a raw material gas of a carbon source into the plastic container, and applying a voltage between the first and second outer electrodes and the inner electrode thereby to generate plasma to form a DLC film on the inner surface of the plastic container by providing a high-frequency electric power to only the first outer electrode, wherein lower power is applied to the second outer electrode than to the first outer electrode by capacitive coupling.

7. A method for producing DLC film-coated plastic containers having a bottom portion, a body portion which is located above said bottom portion and a shoulder portion which is located above said body portion, comprising the steps of, disposing a first outer electrode outside a plastic container and along the bottom portion of the plastic container, disposing a second outer electrode outside the plastic container and along the body portion of the plastic container, disposing a third outer electrode outside the plastic container and along the shoulder portion of the plastic container, interposing resistive or capacitive elements, which also serves as a sealing material, between each of the outer electrodes to prevent the flow of direct electric current, disposing an inner electrode inside the plastic container, creating a vacuum in the plastic container, then feeding a raw material gas of a carbon source into the plastic container, and applying a voltage between the first, second and third outer electrodes and the inner electrode thereby to generate plasma to form a DLC film on the inner surface of the plastic container by providing a high-frequency electric power to only the first outer electrode.

8. A method for producing DLC film-coated plastic containers, having a bottom portion, a body portion which is located above said bottom portion, and a shoulder portion which is located above said body portion, composing the steps of; disposing a first outer electrode outside a plastic container and along the bottom portion of the plastic container, disposing a second outer electrode outside the plastic container and above the first outer electrode, disposing at least two additional outer electrodes outside the plastic container and above the second outer electrode, interposing resistive or capacitive elements, which also serves as a sealing material, between each of the outer electrodes to prevent the flow of direct electric current, disposing an inner electrode inside the plastic container, creating a vacuum in the plastic container, then feeding a raw material gas of a carbon source into the plastic container, and applying a voltage between the first and second outer electrodes combined with at least two other outer electrodes above the second outer electrode, and the inner electrode thereby to generate plasma to form a DLC film on the inner surface of the plastic container by providing a high frequency electric power to only the first outer electrode.

9. The method for producing DLC film-coated plastic containers as claimed in claim 7 or 8, wherein lower power is applied to the outer electrodes other than the first outer electrode by capacitive coupling.

10. The method for producing DLC film-coated plastic containers as claimed in claim 7 or 8, wherein the high-frequency electric power required for each portion of the container other than the bottom portion is imparted by capacitive coupling.

* * * * *